(12) United States Patent
Svärd

(10) Patent No.: US 12,337,720 B2
(45) Date of Patent: Jun. 24, 2025

(54) CONTROLLING A BATTERY MODULE COMPRISING A PLURALITY OF SWITCHED BATTERY CELL UNITS

(71) Applicant: Scania CV AB, Södertälje (SE)

(72) Inventor: Henrik Svärd, Saltsjö-Boo (SE)

(73) Assignee: Scania CV AB, Södertälje (SE)

(*) Notice: Subject to any disclaimer, the term of this patent is extended or adjusted under 35 U.S.C. 154(b) by 502 days.

(21) Appl. No.: 17/781,654

(22) PCT Filed: Dec. 8, 2020

(86) PCT No.: PCT/SE2020/051176
§ 371 (c)(1),
(2) Date: Jun. 1, 2022

(87) PCT Pub. No.: WO2021/118436
PCT Pub. Date: Jun. 17, 2021

(65) Prior Publication Data
US 2023/0001823 A1    Jan. 5, 2023

(30) Foreign Application Priority Data
Dec. 12, 2019    (SE) .................... 1951438-9

(51) Int. Cl.
*B60L 58/19*    (2019.01)
*B60L 58/22*    (2019.01)
(Continued)

(52) U.S. Cl.
CPC ............... *B60L 58/19* (2019.02); *B60L 58/22* (2019.02); *G01R 31/3835* (2019.01);
(Continued)

(58) Field of Classification Search
CPC .... B60L 58/19; B60L 58/22; B60L 2240/547; G01R 31/3835; H01M 10/425;
(Continued)

(56) References Cited

U.S. PATENT DOCUMENTS 6,121,752 A * 9/2000 Kitahara .................. H02J 7/005
320/122
9,413,234 B2 * 8/2016 Tomasz .................... H02J 7/345
(Continued)

FOREIGN PATENT DOCUMENTS

WO    2016020154 A1    2/2016

OTHER PUBLICATIONS

Tenca Pierluigi, "Stochastic Waveform Synthesis for Multilevel Converters via the Central Limit Theorem of the Theory of Probability", Research Disclosure, Kenneth Mason Publications, Feb. 1, 2013, p. 121, vol. 586, No. 20, Hampshire, UK, GB, 15 pages.

(Continued)

*Primary Examiner* — M Baye Diao
(74) *Attorney, Agent, or Firm* — Moore & Van Allen PLLC; W. Kevin Ransom

(57) ABSTRACT

A battery module comprising a plurality of battery cell units, each one comprising: a battery cell having a first pole and a second pole, and a switch circuit, comprising a plurality of switches, and a switch controller arranged to control the switches of the switch circuit to enter either of a first state, in which the battery cell is connected in parallel with a neighboring battery cell, and a second state, in which the battery cell is connected in series with a neighboring battery cell. The battery module is configured to control the switching between the first and second states on a probabilistic basis.

14 Claims, 6 Drawing Sheets

(51) Int. Cl.
| | |
|---|---|
| *G01R 31/3835* | (2019.01) |
| *H01M 10/42* | (2006.01) |
| *H01M 10/48* | (2006.01) |
| *H01M 50/204* | (2021.01) |
| *H01M 50/249* | (2021.01) |
| *H01M 50/51* | (2021.01) |
| *H01M 50/512* | (2021.01) |
| *H02J 7/00* | (2006.01) |

(52) U.S. Cl.
CPC ....... *H01M 10/425* (2013.01); *H01M 10/482* (2013.01); *H01M 50/204* (2021.01); *H01M 50/249* (2021.01); *H01M 50/51* (2021.01); *H01M 50/512* (2021.01); *H02J 7/0013* (2013.01); *H02J 7/007182* (2020.01); *H01M 2220/20* (2013.01); *H02J 7/0019* (2013.01)

(58) Field of Classification Search
CPC ............. H01M 10/482; H01M 50/204; H01M 50/249; H01M 50/51; H01M 50/512; H01M 2220/20; H02J 7/0013; H02J 7/007182; H02J 7/0019; H02J 7/0014; H02J 7/0024; H02M 7/49; H02M 1/0048; H02M 7/4835
USPC ........................................................ 320/117
See application file for complete search history.

(56) References Cited

U.S. PATENT DOCUMENTS

| | | | | |
|---|---|---|---|---|
| 9,807,932 | B2* | 11/2017 | French, Jr. | ............ A01F 12/446 |
| 10,232,730 | B2* | 3/2019 | Friedrich | ............ H01M 10/482 |
| 11,327,492 | B2* | 5/2022 | Berntorp | ................ G07C 5/085 |
| 11,710,876 | B2* | 7/2023 | Hinterberger | ....... H01M 50/502 |
| | | | | 429/50 |
| 2012/0319493 | A1 | 12/2012 | Kim et al. | |
| 2014/0210380 | A1 | 7/2014 | Butzmann | |
| 2014/0312828 | A1 | 10/2014 | Vo et al. | |
| 2014/0375291 | A1* | 12/2014 | Tomasz | ................. H02M 3/156 |
| | | | | 323/282 |
| 2015/0077069 | A2 | 3/2015 | Weyh et al. | |
| 2016/0164328 | A1* | 6/2016 | Kim | ......................... H02J 7/00 |
| | | | | 320/112 |
| 2016/0239759 | A1* | 8/2016 | Sung | ..................... H01M 10/48 |
| 2017/0207631 | A1 | 7/2017 | Helling et al. | |
| 2017/0232863 | A1* | 8/2017 | Friedrich | ................ B60L 58/12 |
| | | | | 320/134 |
| 2019/0103750 | A1* | 4/2019 | Kristensen | .......... H01M 10/441 |
| 2021/0165409 | A1* | 6/2021 | Berntorp | .............. G05D 1/0214 |

OTHER PUBLICATIONS

Scania CV AB, European Patent Application No. 20899475.6, Extended European Search Report, Feb. 21, 2024.

Scania CV AB, International Patent Application No. PCT/SE2020/051176, International Search Report, Jan. 25, 2021.

Scania CV AB, International Patent Application No. PCT/SE2020/051176, Written Opinion, Jan. 25, 2021.

Scania CV AB, Swedish Patent Application No. 1951438-9, Office Action, May 22, 2020.

Goetz, S.M., et al., "Control of Modular Multilevel Converter With Parallel Connectivity-Application to Battery Systems", IEEE Transactions on Power Electronics, pp. 8381-8392, vol. 32, No. 11, Nov. 2017.

Goetz, S.M., et al., "Sensorless Scheduling of the Modular Multilevel Series-Parallel Converter: Enabling a Flexible, Efficient, Modular Battery", IEEE Applied Power Electronics Conference and Exposition (APEC), pp. 2349-2354, 2016.

Scania CV AB, International Patent Application No. PCT/SE2020/051176, International Preliminary Report on Patentability, May 17, 2022.

\* cited by examiner

CONTROLLING A BATTERY MODULE COMPRISING A PLURALITY OF SWITCHED BATTERY CELL UNITS

CROSS-REFERENCE TO RELATED APPLICATIONS

This application is a National Stage Patent Application (filed under 35 § U.S.C. 371) of PCT/SE2020/051176, filed Dec. 8, 2020, of the same title, which, in turn claims priority to Swedish Patent Application No. 1951438-9 filed Dec. 12, 2019, of the same title; the contents of each of which are hereby incorporated by reference.

FIELD OF THE INVENTION

The present invention relates to a method of controlling the output voltage of a battery module, said module comprising: a plurality of battery cell unit, each one comprising: a battery cell having a first pole and a second pole, and a switch circuit, comprising a plurality of switches, and a switch controller arranged to control the switches of the switch circuit to enter either of a first state and a second state.

The invention also relates to such a battery module. If all the switch circuits are in the first state, the battery cell units will be connected in parallel, such that a minimum output voltage is obtained from the battery module, and if all switch circuits of the battery module are in the second state, the battery cell units will be connected in series, such that a maximum output voltage is obtained from the battery module. By controlling the switch circuits, it is thus possible to control to output voltage of the battery module to levels between the minimum and maximum output voltage.

BACKGROUND OF THE INVENTION

In an electrical vehicle, energy is stored in a battery pack, consisting of one or more battery modules, each having a number of battery cells. The cells typically have a low voltage, in the order of a couple of Volts. The electric machines driving the vehicle typically need an alternating current, with a voltage in the order of hundreds of volts. The battery packs therefore contain hundreds of cells connected in series, to obtain the maximum voltage needed by the engine. To convert this high constant voltage to an alternating voltage of variable amplitude, a device called inverter is used. The inverter converts the constant voltage to an alternating, typically sinusoidal voltage, of variable amplitude.

There are inefficiencies involved in the conversion by the inverter of the constant high voltage to a variable voltage. Therefore, one may propose a battery with internal switches, which connects and disconnects individual cells, in order to achieve an alternating voltage at the terminals of the battery pack. The switches must be controlled in some manner by a master controller, which decides what voltage is currently needed.

Since the number of cells in a battery pack is large, in the order of hundreds, a very large number of switches need to be controlled, if each cell is to be switched on or off individually. The cells could be grouped together, with the groups switched on or off together, but this reduces the granularity of the possible output voltage of the battery. Also, to know which switch to switch on or off, the master controller must possess detailed knowledge of the layout of the battery pack, i.e. which cell is adjacent to which switch, etc.

Another problem with the present technology is that the internal power losses of the battery are not minimized. Using a large battery pack of serially connected cells, the maximum output voltage is n*Ucell, where n is the number of cells, and Ucell is the voltage of each cell. If, for example, half of this maximum voltage is needed at some instance, the power lost due to internal resistance of the cells is $(I)^2 \ast Rcell \ast n/2$, where I is the current drawn from the battery pack, and Rcell is the internal resistance of a battery cell. However, if the battery pack had been arranged into two groups of equally many cells, the cells in each group were serially connected, and the two groups were connected in parallel, losses due to internal resistance were reduced to $2 \ast (I/2)^2 \ast Rcell \ast n/2 = (I/2)^2 \ast Rcell \ast n = \frac{1}{4} \ast (I)^2 \ast Rcell \ast n$.

Thus, the internal losses were halved, by configuring the battery pack optimally for this specific output voltage.

Another problem is battery pack balancing. If the cells of a battery pack are connected in series, there is a need to introduce extra circuits to transfer electrical charge between the cells, in order to balance the state of charge throughout the pack.

SUMMARY OF THE INVENTION

It is an object of the present invention to propose a battery module and a method of controlling the output voltage of that battery module, which, with a minimal amount of communication, reconfigures the battery module to minimize the internal losses at every instant. It is also an object of the invention to present a battery module and a method for controlling the output voltage thereof that alleviate the need for balancing circuits, since the cells at certain points in time are connected in parallel, thereby facilitating automatic balancing.

The objects of the invention are achieved by means of a method of controlling the output voltage of a battery module. The battery module comprises a plurality of battery cell units, each one comprising:
a battery cell having a first pole and a second pole, and
a switch circuit, comprising
a first input connected to a first output via a first switch,
a second input connected to a second output via a second switch, and
a third switch, via which the second input is connected to the first output, wherein the first pole of the battery cell is connected to the first input and the second pole is connected to the second input.

The battery module further comprises a switch controller arranged to control the switches of the switch circuit to enter either of
a first state in which the first input is connected to the first output, and the second input is connected to the second output, and the second input is disconnected from the first output, and
a second state in which the first input is disconnected from the first output, and the second input is disconnected from the second output and connected to the first output.
The method comprises the steps of:
measuring an output voltage V of the battery module at one of the first and second outputs,
generating a differential value by measuring a difference between the measured output voltage V and a reference voltage Vref, said reference voltage Vref being within a range from a nominal minimum output voltage Vmin of the battery module to a nominal maximum output voltage Vmax of the battery module, generating a probability value p on basis of the differential value, said probability value being proportional to an absolute value of the differential value, and being within an interval representing 0% to 100% probability, generating a random number r, by means of a random number generator, within said interval, comparing the probability value p with the random number r, and, a) if the switch circuit is in the first state and V-Vref<0, and p>r, the state is changed to the second state, or, b) if the switch circuit is in the second state and V-Vref>0 and p>r, the state is changed to the first state, or, c) if p=0, and the switch circuit is in the first state or in the second state, the state is not changed.

If p=r or p<r, the state is not changed.

The present invention proposes a layout of the battery module with switches, and a control strategy, which, with a minimal amount of communication, reconfigures the battery module to minimize the internal losses at every instant. The invention also alleviates the need for balancing circuits, since the cells at certain points in time are connected in parallel, facilitating automatic balancing. The proposed control strategy consists of a master controller, comprising the voltage regulator and the switch controller, which at each instance possesses knowledge of the necessary output voltage from the battery, i.e. the reference voltage. The master controller is able to broadcast a signal to all of the switches in the battery module. Note that the same signal is sent to all switches, hence only a single communication channel is needed.

A characteristic of the invention is the probabilistic nature of the control of the switch circuits. The switch controllers receive a probability of changing their state, the probability value. Each switch controller, in combination with the random number generator, has a way of internally "rolling a dice", to determine its action. This means that although each switch controller receives the same signal (probability value), the switches behave differently (depending on the number generated by the random number generator), an objective that would be more complicated to achieve if using a completely deterministic switch logic.

The master controller measures the current output voltage, and compares it to the desired value, the reference voltage. If the output voltage is higher than the reference voltage, the voltage regulator outputs a differential value>0, and if it is lower than the reference voltage, the voltage regulator outputs a differential value<0. The specific choice of the value may be done in a number of ways, for example a standard proportional integral derivative (PID)-controller.

The switches located between the battery cells receive a control signal (change state or remain), and update their state at some frequency, for example once every millisecond. All coordination is conducted through the control signal, which leads to the battery cells configuring themselves into parallel groups of serially coupled cells.

Compared to a deterministic solution, which presumes that each battery cell has a predetermined voltage, the present probabilistic approach will automatically adapt the states of the switch circuits, and thus the output voltage to any unforeseen deviation in voltage (or charge) contribution of any of the battery cells. Since the control scheme for the switches has a random element, the resulting parallel groups are not constant, but vary over time, allowing different cells to equalize their charge with each other.

Losses due to internal resistance are minimized, since the cells are constantly reconfigured into the optimal number of parallel groups.

The master controller needs no knowledge of the internal configuration of the battery module, it only measures output voltage and sends a control signal accordingly. Hence, the concept is very modular, and it is possible for example to add or remove battery cells with corresponding switch units, with original functionality maintained.

Only a single one-way communications channel is required from the master controller to the switches of the respective switch circuits.

The probabilistic nature of the control system is essential. If all switch circuits reacted deterministically, then a certain control signal which made one switch circuit change its state, would also change the state of every other switch circuit, creating a too large step in output voltage. By the randomness of the control scheme, it is possible to change the state of only one (or possibly a couple) switch circuits at a time, keeping the possible overvoltage to within reasonable limits.

According to one embodiment, the probability value p is proportional to the difference between the measured output voltage V and the reference voltage Vref. The nominal minimum and maximum output voltages set the limits of the differential value. The differential value is preferably multiplied with a factor that results in a suitable range for the probability value, for example such that the probability value may range from 0 to 100. The random number generator may then be configured to generate integers from 0 to 100. The voltage of each battery cell and the number of battery cells may also be taken into consideration when deciding which factor to use for the generation of the probability value on basis of the differential value.

According to one embodiment, the nominal minimum voltage Vmin corresponds to a state in which all the battery cells of the battery module are connected in parallel with each other, and the nominal maximum voltage Vmax, corresponds to a state in which all the battery cells of the battery module are connected in series with each other.

The method thereby comprises the steps of measuring a difference between the measured output voltage and the one of the nominal minimum voltage and the nominal maximum voltage that is closer to the reference voltage than to the measured output voltage generating a modifying value, which is proportional to said measured difference, and modifying the differential value on basis of the modifying value, wherein the probability value is generated on basis of said modified differential value.

Thereby, the probability value is modified in order to compensate for the number of battery cells (switch circuits) being in a specific state. If all battery cells are connected in parallel (first state), and an increased output voltage is requested, i.e. the reference voltage is higher than the nominal minimum output voltage, a lot of switch circuits could potentially switch to the second state. However, if all switch circuits but one or a few more ones are already in the second state, and an increased output voltage is requested, only said one or more switch circuits can accomplish this increase of the voltage output. Therefore, the probability for those one or more switch circuits to change state should be increased in order to have a quick response from the system and quickly reach the requested output voltage, i.e. the reference voltage. The system would function without this compensation but would be slower the closer to the minimum and maximum nominal output voltage that the reference voltage is.

According to one embodiment, the modifying of the differential value comprises the step of dividing the differential value with the modifying value.

According to one embodiment, the method comprises repeating the steps of the method with a predetermined frequency. The method is an iterative method of reaching a requested output voltage, i.e. the reference voltage. It is a matter of choice to select a suitable frequency. For example, the steps of the method may be repeated each microsecond.

The objects of the invention are also achieved by means of a battery module for a vehicle, the battery module comprising a plurality of battery cell units. Each battery cell unit comprises:
a battery cell having a first pole and a second pole, and
a switch circuit, comprising
a first input connected to a first output via a first switch,
a second input connected to a second output via a second switch, and
third switch, via which the second input is connected to the first output.

The first pole of the battery cell is connected to the first input and the second pole is connected to the second input.

The battery module further comprises switch controller arranged to control the switches of the switch circuit to enter either of
a first state in which the first input is connected to the first output, and the second input is connected to the second output, and the second input is disconnected from the first output, and
a second state in which the first input is disconnected from the first output, and the second input is disconnected from the second output and connected to the first output.

The switch controller comprises an input for receiving a probability signal that indicates a probability for the switch circuit to enter the first state or the second state.

The battery module further comprises
a voltage regulator configured to measure an output voltage at one of the first and second outputs, to compare the measured output voltage with a reference voltage, the reference voltage Vref being in a range from a nominal minimum output voltage Vmin of the battery module to a nominal maximum output voltage Vmax of the battery module, and the voltage regulator being configured to generate a differential value on basis of the comparison, and to generate a probability value on basis of the differential value, the probability value being proportional to an absolute value of the differential value, and being within an interval representing from 0% to a value corresponding to 100% probability, and transmit the probability value to the switch controller, and
a random number generator generating a random number r within the interval.

The switch controller is configured to receive the random number, comparing the probability value with the random number, and,
a) if the switch circuit is in the first state and V−Vref<0, and p>r, to change the state to the second state, or,
b) if the switch circuit is in the second state and V−Vref>0 and p>r, to change the state to the first state, or,
c) if p=0, and the switch circuit is in the first state or in the second state, the state is not changed.

According to one embodiment, the probability value is proportional to the difference between the measured output voltage and the reference voltage.

According to one embodiment, the method comprises that
the nominal minimum voltage Vmin corresponds to a state in which all the battery cells of the battery module are connected in parallel with each other, and that
the nominal maximum voltage Vmax, corresponds to a state in which all the battery cells of the battery module are connected in series with each other, wherein the voltage regulator is configured to
measure a difference between the measured output voltage and the one of the nominal minimum voltage and the nominal maximum voltage that is closer to the reference voltage than to the measured output voltage
generate a modifying value, which is proportional to said measured difference, and
modify the differential value on basis of the modifying value, wherein the probability value is generated on basis of said modified differential value.

According to one embodiment, the voltage regulator comprises
a first differential amplifier circuit configured to generate a differential signal which is proportional to the difference between the measured output voltage and the reference voltage, and
a modifying circuit which comprises
a second differential amplifier circuit.

The second differential amplifier circuit is configured to measure
a) the difference between a nominal maximum output voltage of the battery module and the measured output voltage for the case in which the reference voltage is higher than the measured output voltage and
b) the difference between a nominal minimum output voltage of the battery module and the measured output voltage for the case in which the reference voltage is lower than the nominal minimum output, and
configured to generate a modifying value which is proportional to the measured difference, and
a divider configured to generate said modified differential value by dividing said differential value with the modifying value.

According to one embodiment, the battery module comprises a pole shifting arrangement.

The invention also relates to a vehicle comprising a battery module according to the invention.

According to one embodiment, energy for propulsion of the vehicle is electric energy stored in one or more batteries carried by the vehicle, the vehicle comprising at least one battery module according to the invention, and wherein an engine of the vehicle for the propulsion of the vehicle is an electric motor.

The invention also relates to a computer program comprising a computer program code for causing a computer to implement a method according to the invention when the computer program is executed in the computer.

The invention also relates to a computer program product comprising a non-transitory data storage medium which can be read by a computer and on which the program code of a computer program as disclosed hereinabove.

The invention also relates to an electronic control arrangement of a motor vehicle comprising an execution means and a data storage medium which is connected to the execution means and on which the computer program code of a computer program product according to the invention is stored.

DETAILED DESCRIPTION OF EMBODIMENTS

Figure 1:
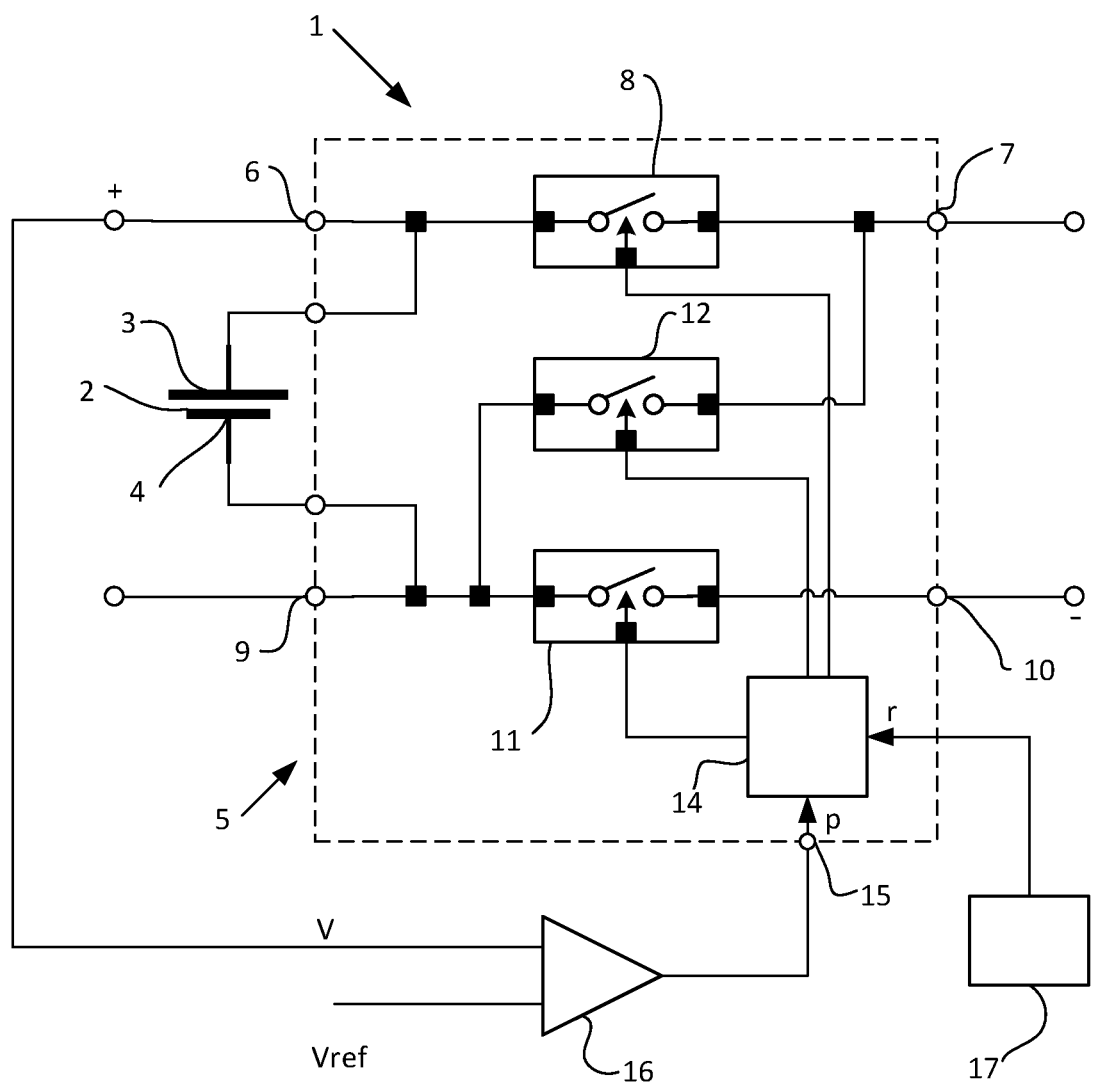
FIG. 1 is a schematic representation of a part of a battery module according to the invention.

Reference is made to FIG. 1, in which a first embodiment of a battery module according to the present invention is shown. Only a part of the module is shown, and it should be understood that the battery module may comprise a plurality of battery cell units like the one shown in FIG. 1, connected to each other in accordance with the teaching of the invention and as indicated in, for example, FIG. 4.

The battery module comprises a plurality of battery cell units 1, each one comprising: a battery cell 2 having a first pole 3 and a second pole 4, and a switch circuit 5. The switch circuit 5 comprises a first input 6 connected to a first output 7 via a first switch 8, a second input 9 connected to a second output 10 via a second switch 11, and a third switch 12, via which the second input 9 is connected to the first output 7. The first pole 3 of the battery cell 2 is connected to the first input 6 and the second pole 4 is connected to the second input 9.

The battery module also comprises a switch controller 14 arranged to control the switches 8, 11, 12 of the switch circuit 5 to enter either of a first state in which the first input 6 is connected to the first output 7, and the second input 9 is connected to the second output 10, and the second input 9 is disconnected from the first output 7, and a second state in which the first input 6 is disconnected from the first output 7, and the second input 9 is disconnected from the second output 10 and connected to the first output 7.

The switch controller 14 comprises an input 15 for receiving a probability signal p that indicates a probability for the switch circuit 5 to enter the first state or the second state.

The battery module further comprises a voltage regulator 16 configured to measure an output voltage V at one of the first and second outputs 7, 10, to compare the measured output voltage V with a reference voltage Vref. The reference voltage Vref is in a range from a nominal minimum output voltage Vmin of the battery module to a nominal maximum output voltage Vmax of the battery module. The voltage regulator 16 is configured to generate a differential value d on basis of said comparison, and to generate a probability value p on basis of the differential value d. The probability value p is proportional to an absolute value of the differential value d and is within an interval representing from 0 to a value corresponding to 100% probability. The voltage regulator 16 is configured to transmit the probability value p to the switch controller 14.

The battery module further comprises a random number generator 17 generating a random number r within said interval. The switch controller 14 is configured to receive the random number r, to compare the probability value p with the random number r, and, a) if the switch circuit 5 is in the first state and V−Vref<0, and p>r, to change the state to the second state, or, b) if the switch circuit 5 is in the second state and V−Vref>0 and p>r, to change the state to the first state, or, c) if p=0, and the switch circuit 5 is in the first state or in the second state, not to change the state.

The probability value p is proportional to the difference between the measured output voltage V and the reference voltage Vref.

Figure 2:
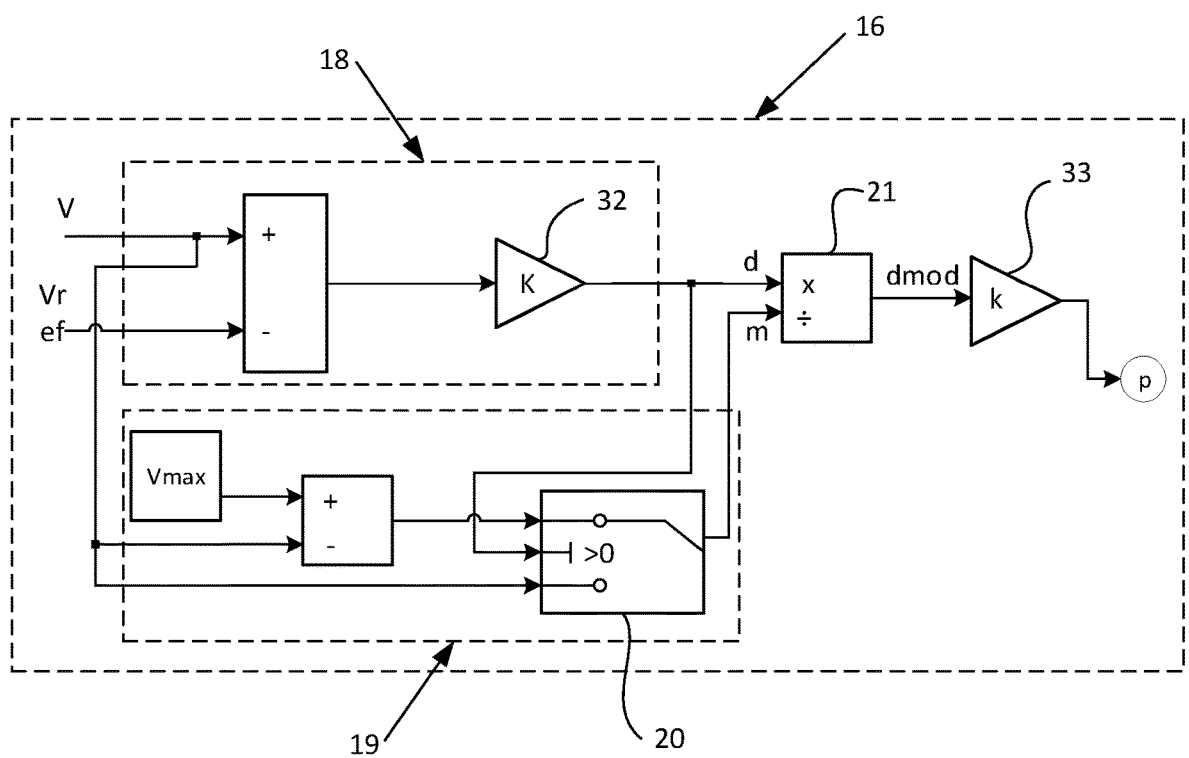
FIG. 2 is a detailed representation of an embodiment of a voltage regulator according to the present invention.

Reference is now made to FIG. 2, which shows a further developed embodiment of the voltage regulator. The nominal minimum voltage Vmin corresponds to a state in which all the battery cells 2 of the battery module are connected in parallel with each other. The nominal maximum voltage Vmax corresponds to a state in which all the battery cells of the battery module are connected in series with each other. The voltage regulator 16 is configured to measure a difference between the measured output voltage V and the one of the nominal minimum voltage Vmin and the nominal maximum voltage Vmax that is closer to the reference voltage Vref than to the measured output voltage V. The voltage generator 16 is also configured to generate a modifying value m, which is proportional to said measured difference. The voltage regulator is thereby configured to modify the differential value d on basis of the modifying value m, wherein the probability value p is generated on basis of the thus modified differential value dmod.

The voltage regulator 16 comprises a first differential amplifier circuit 18 configured to generate a differential value d which is proportional to the difference between the measured output voltage V and the reference voltage Vref, and a modifying circuit 19. The modifying circuit comprises a second differential amplifier circuit 20 which is configured to measure the difference between a nominal maximum output voltage Vmax of the battery module and the measured output voltage for the case in which the reference voltage Vref is higher than the measured output voltage and configured to generate a modifying value m which is proportional to the measured difference. This is the case shown in FIG. 2.

The modifying circuit 20 is also configured to measure the difference between a nominal minimum output voltage of the battery module and the measured output voltage for the case in which the reference voltage is lower than the measured output voltage V and configured to generate a modifying value m which is proportional to the measured difference.

The voltage regulator 16 further comprises a divider 21 configured to generate said modified differential value dmod by dividing said differential value d with the modifying value m.

In FIG. 2, reference number 32 indicates a component in which the differential value d is multiplied with a factor K, preferably chosen with regard to the nominal maximum output voltage Vmax and the nominal minimum output voltage Vmin such that the differential value will have a value in the range of −1 to 1. Reference number 33 indicates a component in which the modified differential value dmod is multiplied with a factor k, for example chosen on beforehand with regard to the possible upper and lower limits of the resulting product between the differential value d and the modifying value m such that the absolute value of the modified differential value dmod results in a probability value that is in a suitable range, for example the range from 0 to 100. The random number generator may then suitable be configured to generate an integer with the range of 0-100.

The voltage regulator 16 does not necessarily have to include the modifying circuit 20, but it should be understood that the inclusion of the modifying circuit results in a quicker response of the voltage regulator 16 as the reference voltage Vref and the output voltage V get closer to either of the nominal minimum voltage Vmin or the nominal maximum voltage Vmax.

Figure 3:
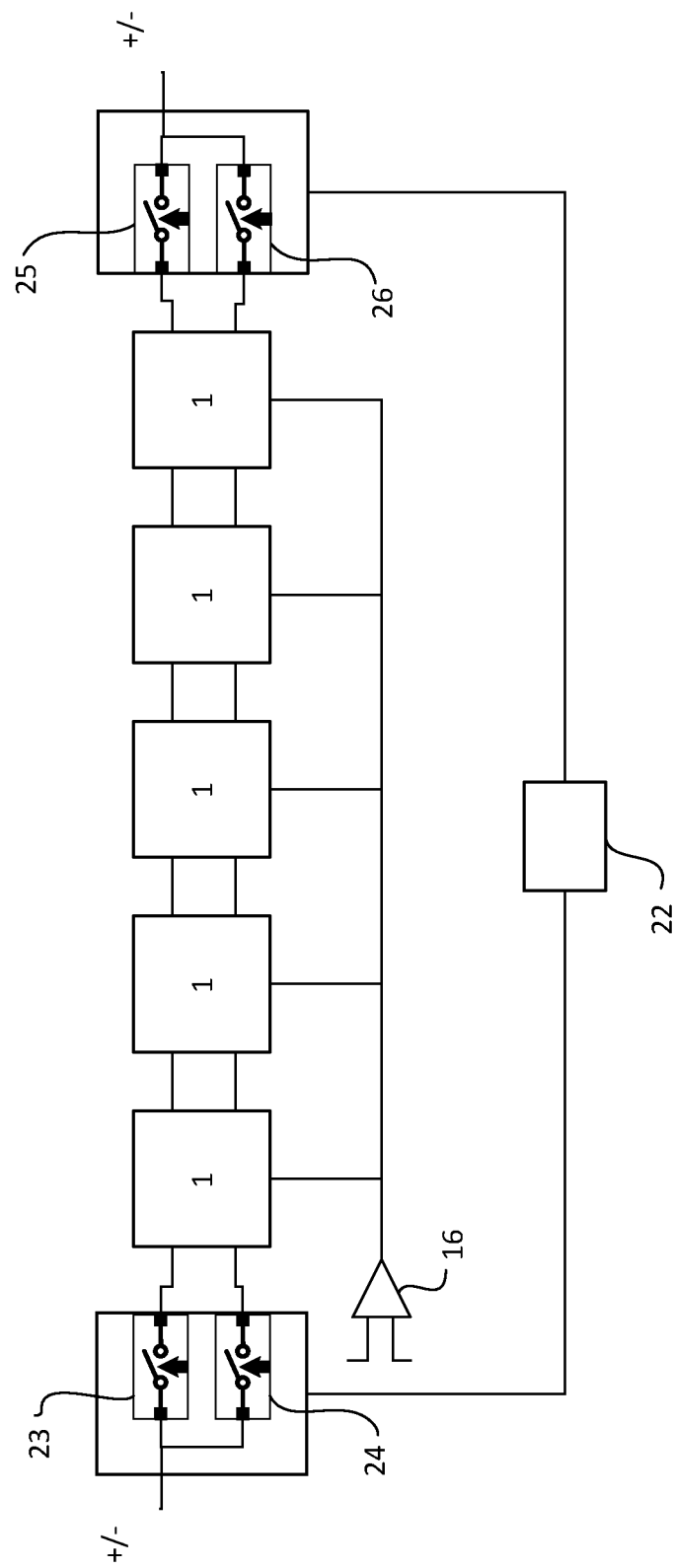
FIG. 3 is a representation of a battery module provided with a pole shifting arrangement.

Reference is made to FIG. 3. The battery module may according to this embodiment comprise a pole-shifting arrangement. In the embodiment shown the pole-shifting arrangement comprises a pole-shifting control module 22 and controllable switches 23, 24, 25, 26, which are provided at opposite ends of the battery module and via which the battery module is connected to a load. By means of the pole-shifting arrangement, the battery module can deliver an alternating current to an AC motor. If no alternating current, AC, is required by the load connected to the battery module, the pole-shifting arrangement may be excluded.

Figure 4:
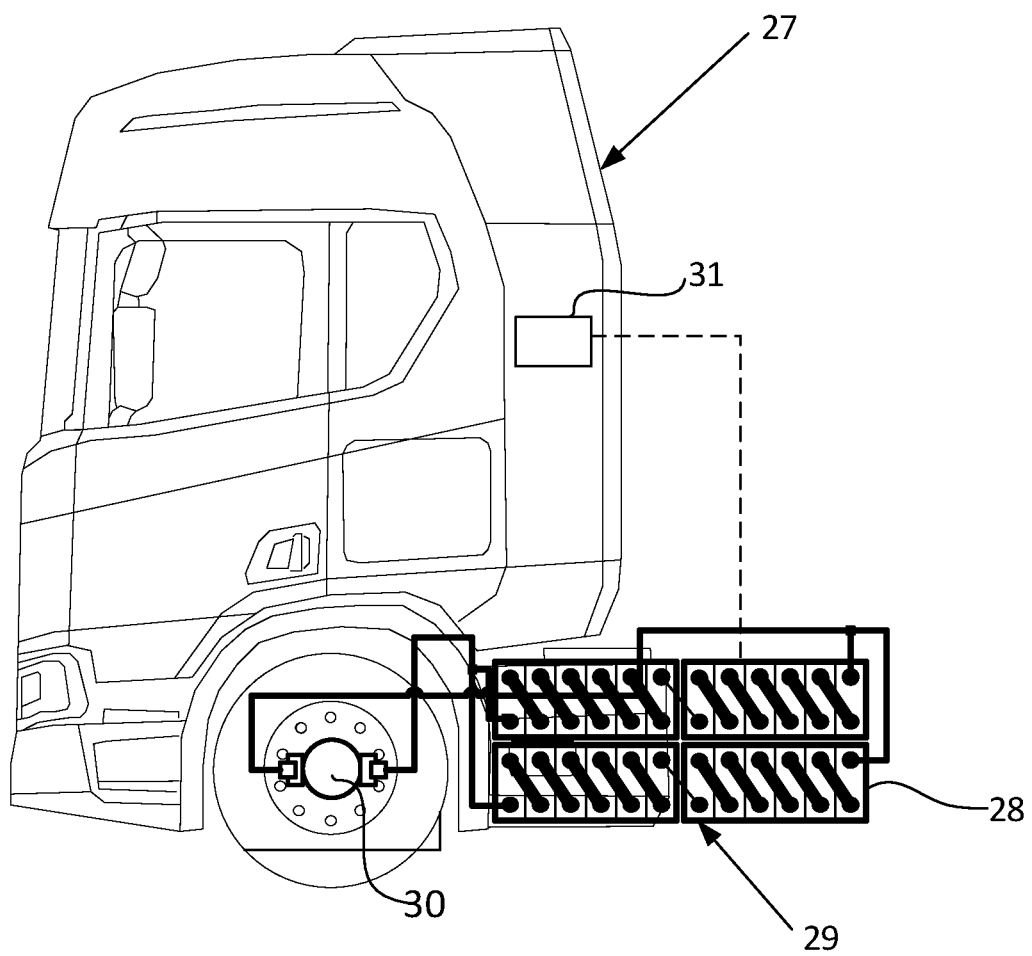
FIG. 4, is a schematic representation of a vehicle according to the invention.

Reference is made to FIG. 4. The invention comprises a vehicle 27, which comprises a battery module 28 according to the present invention, as disclosed hereinabove. Energy for propulsion of the vehicle 27 is electric energy stored in one or more batteries 29 carried by the vehicle 27 and comprising at least one battery module 28 according to embodiments of the present invention. An engine 30 of the vehicle 27 for the propulsion of the vehicle 27 is an electric motor, typically an AC motor.

Figure 5:
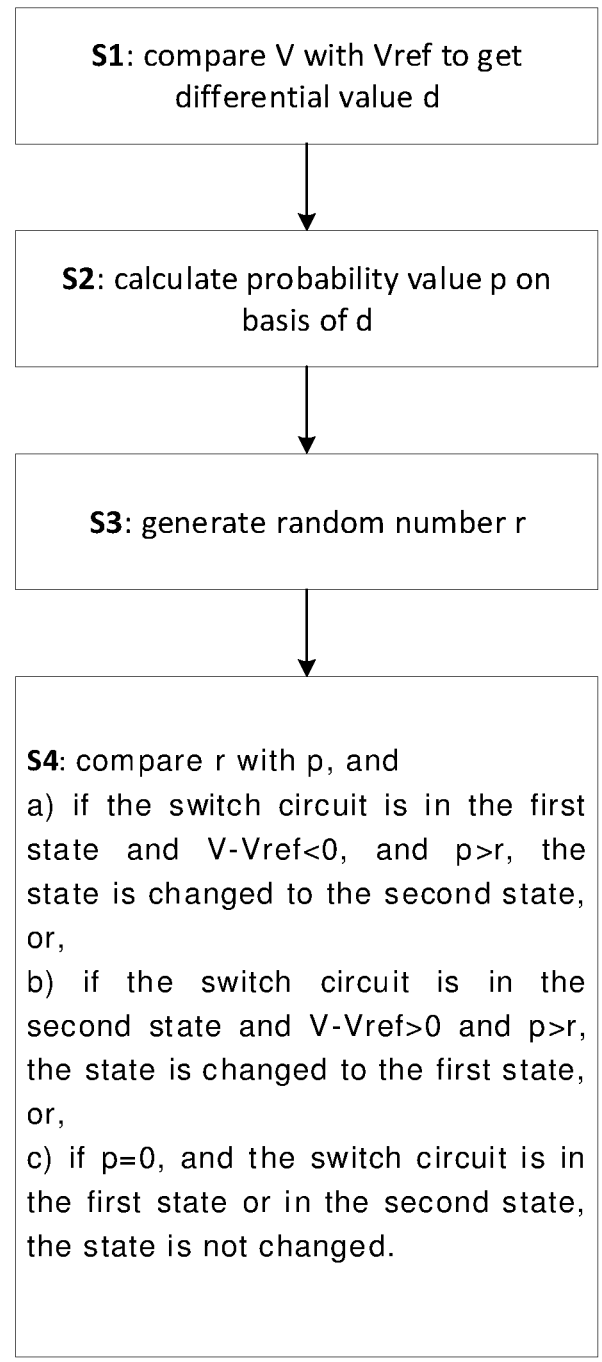
FIG. 5 is a flow scheme showing a first embodiment of the method of the present invention.

A method of controlling the output voltage of a battery module is according to one embodiment of the invention implemented by means of the battery module as disclosed hereinabove. The method, as shown in FIG. 5, thus includes the steps:
- S1) measuring an output voltage V of the battery module at one of the first and second outputs 7, 10, generating a differential value d by measuring a difference between the measured output voltage V and a reference voltage Vref, said reference voltage Vref being within a range from a nominal minimum output voltage Vmin of the battery module to a nominal maximum output voltage Vmax of the battery module,
- S2) generating a probability value p on basis of the differential value d, said probability value being proportional to an absolute value of the differential value d, and being within an interval representing 0% to 100% probability,
- S3) generating a random number r, by means of a random number generator 17, within said interval,
- S4) comparing the probability value p with the random number r, and,
  - a) if the switch circuit 5 is in the first state and V-Vref<0, and p>r, the state is changed to the second state, or,
  - b) if the switch circuit 5 is in the second state and V-Vref>0 and p>r, the state is changed to the first state, or,
  - c) if p=0, and the switch circuit 5 is in the first state or in the second state, the state is not changed.

Figure 6:
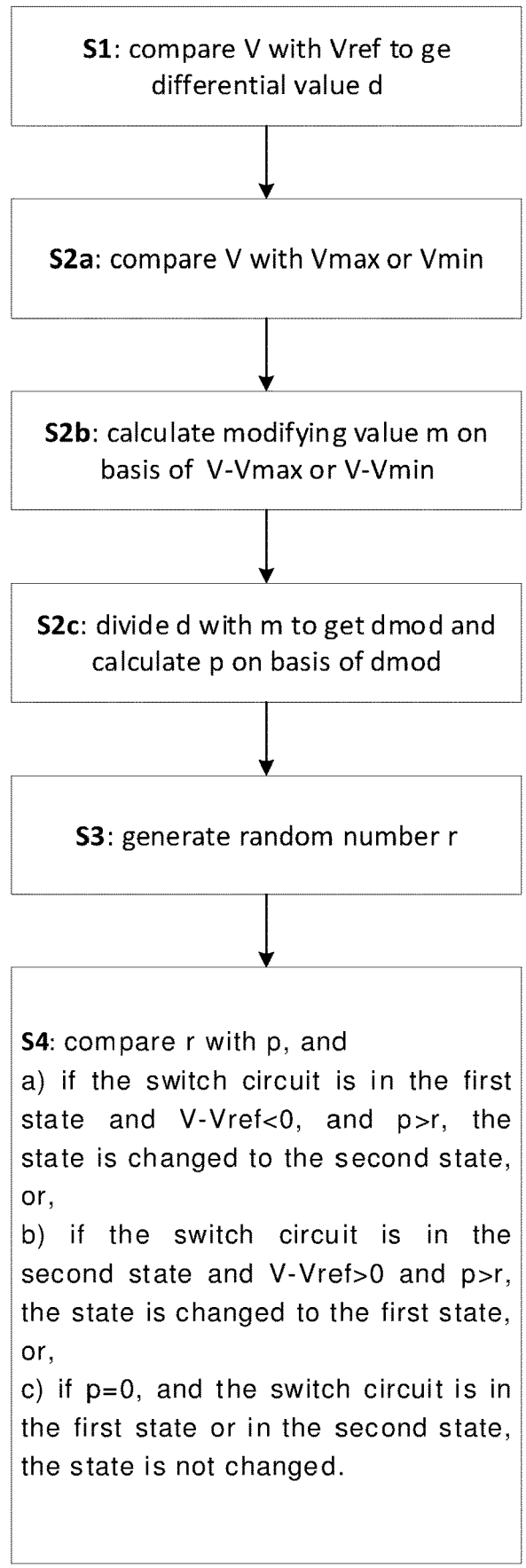
FIG. 6 is a flow scheme showing a second embodiment of the method of the present invention

Reference is made to FIG. 6. If the modifying circuit 20 is incorporated in the voltage regulator 16, step S2 of the method described above comprises the following steps:
- S2a) measuring a difference between the measured output voltage V and the one of the nominal minimum voltage Vmin and the nominal maximum voltage Vmax that is closer to the reference voltage than to the measured output voltage,
- S2b) generating a modifying value m, which is proportional to said measured difference, and
- S2c) modifying the differential value d on basis of the modifying value m, wherein the probability value is generated on basis of said modified differential value dmod.

Above described method steps may according to embodiments of the invention be repeated with a predetermined frequency, for example each microsecond, in order to achieve an output voltage V which is equal to or as close as possible to the requested reference voltage Vref, which may change as a result of changing load. The voltage regulator, the switch controller and the random number generator are thus configured to perform said steps at said frequency.

The invention also relates to a computer program comprising a computer program code for causing a computer to implement a method according to the invention when the computer program is executed in the computer.

The invention also relates to a computer program product comprising a non-transitory data storage medium which can be read by a computer and on which the program code of a computer program as disclosed hereinabove.

The vehicle 27 shown in FIG. 4 comprises an electronic control arrangement 31 that comprises an execution means and a data storage medium which is connected to the execution means and on which the computer program code of a computer program according to the invention is stored.

The invention claimed is:

1. A method of controlling an output voltage of a battery module, said module comprising:
- a plurality of battery cell units, each battery cell unit comprising:
  - a battery cell having a first pole and a second pole; and
  - a switch circuit, comprising:
    - a first input connected to a first output via a first switch;
    - a second input connected to a second output via a second switch; and
    - a third switch, via which the second input is connected to the first output, and
    - wherein the first pole of the battery cell is connected to the first input of the switch circuit and the second pole is connected to the second input of the switch circuit;
- a switch controller arranged to control the switches of the switch circuit to enter one of:
  - a first state in which the first input is connected to the first output via control of the first switch, and the second input is connected to the second output via control of the second switch, and the second input is disconnected from the first output via control of the third switch; and
  - a second state in which the first input is disconnected from the first output via control of the first switch, and the second input is disconnected from the second output via control of the second switch, and the second input is connected to the first output via control of the third switch, said method comprising the steps of:
measuring an output voltage V of the battery module at one of the first and second outputs;
generating a differential value d by measuring a difference between the measured output voltage V and a reference voltage Vref, said reference voltage Vref being within a range from a nominal minimum output voltage Vmin of the battery module to a nominal maximum output voltage Vmax of the battery module;
generating a probability value p on basis of the differential value d, said probability value being proportional to an absolute value of the differential value d, and being within an interval representing 0% to 100% probability;

generating a random number r, by means of a random number generator, within said interval;

comparing the probability value p with the random number r, and:

a) if the switch circuit is in the first state and V-Vref<0, and p>r, the switch controller controls the switches to change the state of the switch controller the second state; or b) if the switch circuit is in the second state and V-Vref>0 and p>r, the switch controller controls the switches to change the state of the switch controller is changed to the first state; or c) if p=0, and the switch circuit is in the first state or in the second state, the state of the switch controller is not changed.

2. A method according to claim 1, wherein the probability value p is proportional to a difference between the measured output voltage V and the reference voltage Vref.

3. A method according to claim 1, wherein the nominal minimum voltage Vmin corresponds to a state in which all the battery cells of the battery module are connected in parallel with each other, and the nominal maximum voltage Vmax, corresponds to a state in which all the battery cells of the battery module are connected in series with each other, and that the method comprises the steps of:

measuring a difference between the measured output voltage and the one of the nominal minimum voltage and the nominal maximum voltage that is closer to the reference voltage than to the measured output voltage;

generating a modifying value m, which is proportional to said measured difference; and modifying the differential value d on basis of the modifying value m, wherein the probability value is generated on basis of said modified differential value.

4. A method according to claim 3, wherein the modifying of the differential value d comprises dividing the differential value d with the modifying value m.

5. A method according to claim 1, further comprising repeating the steps of the method with a predetermined frequency.

6. A battery module for a vehicle, said battery module comprising:

a plurality of battery cell units, each one comprising:
a battery cell having a first pole and a second pole; and
a switch circuit, comprising:
a first input connected to a first output via a first switch;
a second input connected to a second output via a second switch; and
a third switch, via which the second input is connected to the first output, and
wherein the first pole of the battery cell is connected to the first input of the switch circuit and the second pole is connected to the second input of the switch circuit, a switch controller arranged to control the switches of the switch circuit to enter one of:
a first state in which the first input is connected to the first output via control of the first switch, and the second input is connected to the second output via control of the second switch, and the second input is disconnected from the first output via control of the third switch; and
a second state in which the first input is disconnected from the first output via control of the first switch, and the second input is disconnected from the second output via control of the second switch, and the second input is connected to the first output via control of the third switch,
wherein the switch controller comprises an input for receiving a probability signal that indicates a probability for the switch circuit to enter the first state or the second state;

a voltage regulator configured to measure an output voltage V at one of the first and second outputs, to compare the measured output voltage with a reference voltage Vref, said reference voltage Vref being in a range from a nominal minimum output voltage Vmin of the battery module to a nominal maximum output voltage Vmax of the battery module, and said voltage regulator being configured to generate a differential value d on basis of said comparison, and to generate a probability value p on basis of the differential value d, said probability value being proportional to an absolute value of the differential value d, and being within an interval representing from 0% to a value corresponding to 100% probability, and configured to transmit the probability value p to the switch controller; and a random number generator configured to generate a random number r within said interval, wherein the switch controller is configured to receive the random number r, and to compare the probability value p with the random number r, and:

a) if the switch circuit is in the first state and V-Vref<0, and p>r, the switch controller controls the switches to change the state of the switch controller to the second state; or b) if the switch circuit is in the second state and V-Vref>0 and p>r, the switch controller controls the switches to change the state of the switch controller to the first state; or c) if p=0, and the switch circuit is in the first state or in the second state, the state of the switch controller is not changed.

7. A battery module according to claim 6, wherein the probability value p is proportional to a difference between the measured output voltage V and the reference voltage Vref.

8. A battery module according to claim 6, wherein the nominal minimum voltage Vmin corresponds to a state in which all the battery cells of the battery module are connected in parallel with each other, and the nominal maximum voltage Vmax corresponds to a state in which all the battery cells of the battery module are connected in series with each other, wherein the voltage regulator is configured to:

measure a difference between the measured output voltage and the one of the nominal minimum voltage Vmin and the nominal maximum voltage Vmax that is closer to the reference voltage Vref than to the measured output voltage V;

generate a modifying value m, which is proportional to said measured difference; and modify the differential value d on basis of the modifying value m, wherein the probability value p is generated on basis of said modified differential value dmod.

9. A battery module according to claim 6, wherein the voltage regulator comprises:
- a first differential amplifier circuit configured to generate a differential value d which is proportional to the difference between the measured output voltage V and the reference voltage Vref; and
- a modifying circuit which comprises:
  - a second differential amplifier circuit which is configured to measure:
    - a) the difference between a nominal maximum output voltage of the battery module and the measured output voltage for the case in which the reference voltage is higher than the measured output voltage; and
    - b) the difference between a nominal minimum output voltage of the battery module and the measured output voltage for the case in which the reference voltage is lower than the measured output voltage, and
    - configured to generate a modifying value m which is proportional to the measured difference; and
  - a divider configured to generate said modified differential value dmod by dividing said differential value d with the modifying value m.

10. A battery module according to claim 6, further comprising a pole shifting arrangement.

11. A vehicle comprising a battery module comprising:
- a plurality of battery cell units, each one comprising:
  - a battery cell having a first pole and a second pole, and
  - a switch circuit, comprising:
    - a first input connected to a first output via a first switch;
    - a second input connected to a second output via a second switch; and
    - a third switch, via which the second input is connected to the first output, and
    - wherein the first pole of the battery cell is connected to the first input of the switch and the second pole is connected to the second input of the switch;
  - a switch controller arranged to control the switches of the switch circuit to enter one of:
    - a first state in which the first input is connected to the first output via control of the first switch, and the second input is connected to the second output via control of the second switch, and the second input is disconnected from the first output via control of the third switch; and
    - a second state in which the first input is disconnected from the first output via control of the first switch, and the second input is disconnected from the second output via control of the second switch, and the second input is connected to the first output via control of the third switch,
    - wherein the switch controller comprises an input for receiving a probability signal that indicates a probability for the switch circuit to enter the first state or the second state;
- a voltage regulator configured to measure an output voltage V at one of the first and second outputs, to compare the measured output voltage with a reference voltage Vref, said reference voltage Vref being in a range from a nominal minimum output voltage Vmin of the battery module to a nominal maximum output voltage Vmax of the battery module, and said voltage regulator being configured to generate a differential value d on basis of said comparison, and to generate a probability value p on basis of the differential value d, said probability value being proportional to an absolute value of the differential value d, and being within an interval representing from 0% to a value corresponding to 100% probability, and configured to transmit the probability value p to the switch controller; and
- a random number generator configured to generate a random number r within said interval,
- wherein the switch controller is configured to receive the random number r, and to compare the probability value p with the random number r, and,
  - a) if the switch circuit is in the first state and V-Vref<0, and p>r, the switch controller controls the switches to change the state of the switch controller to the second state; or
  - b) if the switch circuit is in the second state and V-Vref>0 and p>r, the switch controller controls the switches to change the state of the switch controller to the first state; or
  - c) if p=0, and the switch circuit is in the first state or in the second state, the state of the switch controller is not changed.

12. A vehicle according to claim 11, wherein energy for propulsion of the vehicle is electric energy stored in one or more battery cell units of the at least one battery module, and wherein an engine of the vehicle for the propulsion of the vehicle is an electric motor.

13. An electronic control arrangement of a motor vehicle comprising:
- one or more controllers; and
- a non-transitory data storage medium which is connected to the at least one controller and comprising program instructions stored thereon for controlling an output voltage of a battery module, said module comprising:
  - a plurality of battery cell units, each battery cell unit comprising:
    - a battery cell having a first pole and a second pole; and
    - a switch circuit, comprising:
      - a first input connected to a first output via a first switch;
      - a second input connected to a second output via a second switch; and
      - a third switch, via which the second input is connected to the first output, and
      - wherein the first pole of the battery cell is connected to the first input and the second pole is connected to the second input;
    - a switch controller arranged to control the switches of the switch circuit to enter either of:
      - a first state in which the first input is connected to the first output via control of the first switch, and the second input is connected to the second output via control of the second switch, and the second input is disconnected from the first output via control of the third switch; and
      - a second state in which the first input is disconnected from the first output via control of the first switch, and the second input is disconnected from the second output via control of the second switch, and the second input is connected to the first output via control of the third switch,
- wherein said computer program instructions configured to cause the one or more controllers to perform the following operations:
- measure an output voltage V of the battery module at one of the first and second outputs;
- generate a differential value d by measuring a difference between the measured output voltage V and a reference voltage Vref, said reference voltage Vref being within a range from a nominal minimum output voltage Vmin of the battery module to a nominal maximum output voltage Vmax of the battery module;

generate a probability value p on basis of the differential value d, said probability value being proportional to an absolute value of the differential value d, and being within an interval representing 0% to 100% probability;

generate a random number r, by means of a random number generator, within said interval;

compare the probability value p with the random number r, and,
  a) if the switch circuit is in the first state and V-Vref<0, and p>r, the switch controller controls the switches to change the state of the switch controller to the second state; or
  b) if the switch circuit is in the second state and V-Vref>0 and p>r, the switch controller controls the switches to change the state of the switch controller to the first state; or
  c) if p=0, and the switch circuit is in the first state or in the second state, the state of the switch controller is not changed.

14. A non-transitory computer readable media comprising program instructions stored thereon for controlling an output voltage of a battery module, said module comprising:
  a plurality of battery cell units, each battery cell unit comprising:
    a battery cell having a first pole and a second pole; and
    a switch circuit, comprising:
      a first input connected to a first output via a first switch;
      a second input connected to a second output via a second switch; and
      a third switch, via which the second input is connected to the first output, and
      wherein the first pole of the battery cell is connected to the first input of the switch circuit and the second pole is connected to the second input of the switch circuit;
    a switch controller arranged to control the switches of the switch circuit to enter one of:
      a first state in which the first input is connected to the first output via control of the first switch, and the second input is connected to the second output via control of the second switch, and the second input is disconnected from the first output via control of the third switch; and
      a second state in which the first input is disconnected from the first output via control of the first switch, and the second input is disconnected from the second output via control of the second switch, and the second input is connected to the first output via control of the third switch, wherein said computer program instructions configured to cause one or more controllers to perform the following operations:

measure an output voltage V of the battery module at one of the first and second outputs;

generate a differential value d by measuring a difference between the measured output voltage V and a reference voltage Vref, said reference voltage Vref being within a range from a nominal minimum output voltage Vmin of the battery module to a nominal maximum output voltage Vmax of the battery module;

generate a probability value p on basis of the differential value d, said probability value being proportional to an absolute value of the differential value d, and being within an interval representing 0% to 100% probability;

generate a random number r, by means of a random number generator, within said interval;

compare the probability value p with the random number r, and:
  a) if the switch circuit is in the first state and V-Vref<0, and p>r, the switch controller controls the switches to change the state of the switch controller to the second state; or
  b) if the switch circuit is in the second state and V-Vref>0 and p>r, the switch controller controls the switches to change the state of the switch controller to the first state; or
  c) if p=0, and the switch circuit is in the first state or in the second state, the state of the switch controller is not changed.

* * * * *